United States Patent
Wang et al.

(10) Patent No.: US 6,395,635 B1
(45) Date of Patent: May 28, 2002

(54) REDUCTION OF TUNGSTEN DAMASCENE RESIDUE

(75) Inventors: Ying-Lang Wang, Taichung; Jowei Dun, Hsin Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/206,741

(22) Filed: Dec. 7, 1998

(51) Int. Cl.$^7$ .................................................. H01L 21/302
(52) U.S. Cl. ........................................... 438/692; 438/693
(58) Field of Search .................................... 438/690, 693; 451/36, 41, 56, 57, 59, 63

(56) References Cited

U.S. PATENT DOCUMENTS

| | | | |
|---|---|---|---|
| 5,611,941 A | 3/1997 | Booth | 216/23 |
| 5,665,202 A | 9/1997 | Subramian et al. | 438/692 |
| 5,711,818 A * | 1/1998 | Jain | 134/6 |
| 5,733,177 A * | 3/1998 | Tsuchiya et al. | 451/41 |
| 5,759,917 A | 6/1998 | Grouer et al. | 438/690 |
| 5,766,992 A | 6/1998 | Chou et al. | 438/241 |
| 5,816,891 A * | 10/1998 | Woo | 451/6 |
| 5,947,802 A * | 9/1999 | Zhang et al. | 451/334 |
| 5,951,373 A * | 9/1999 | Shendon et al. | 451/41 |

* cited by examiner

Primary Examiner—Benjamin L. Utech
Assistant Examiner—Kin-Chan Chen
(74) Attorney, Agent, or Firm—George O. Saile; Stephen B. Ackerman

(57) ABSTRACT

A CMP process is provided for the reduction of tungsten damascene residue and the elimination of surface scratch within the surface that is being polished. A three step polishing procedure of the ILD is followed by a two step buffing procedure of the ILD. The three step polishing procedure reduces the device defect count by eliminating damascene residue from the polished surface. The two step buffing procedure reduces micro scratch within the polished surface thus improving device throughput. A two step buffing procedure is applied to the IMD. Oxide buffing is applied and consists of a three step polishing procedure followed by a two step buffing procedure.

26 Claims, 3 Drawing Sheets

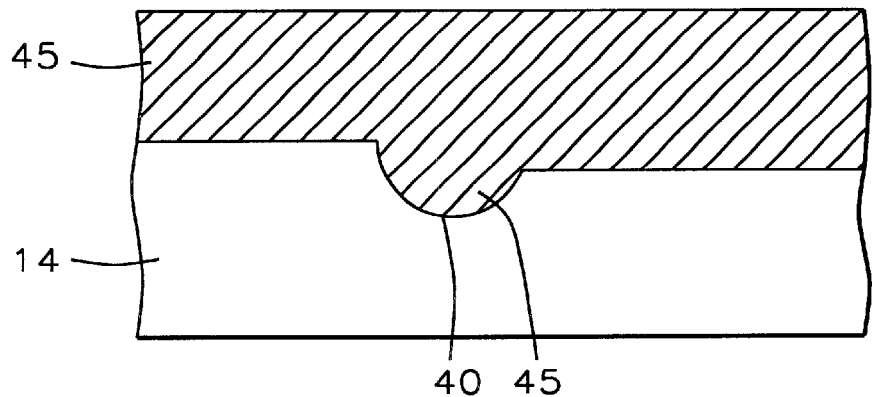
*FIG. 1A - Prior Art*
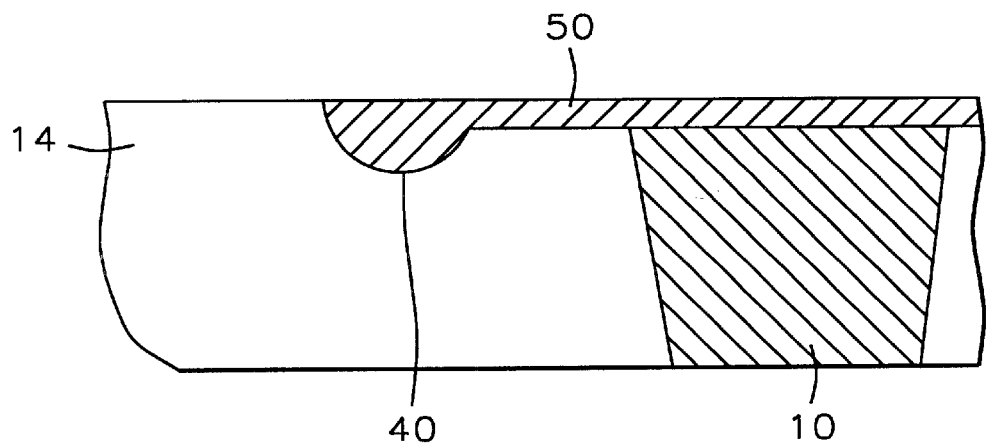
*FIG. 1B - Prior Art*

REDUCTION OF TUNGSTEN DAMASCENE RESIDUE

BACKGROUND OF THE INVENTION (1) Field of the Invention

The invention relates to the field of semiconductor integrated circuit manufacturing, and more specifically to the polishing of semiconductor wafers by applying Chemical Mechanical Planarization (CMP) of Inter Level Dielectric (ILD) and Inter Metal Dielectric (IMD).

(2) Description of the Prior Art

The increasing need to form planar surfaces in semiconductor device fabrication has led to the development of a process technology known as Chemical Mechanical Planarization (CMP). In the CMP process, semiconductor substrates are rotated, face down, against a polishing pad in the presence of abrasive slurry. Most commonly, the layer to be planarized is an electrical insulating layer overlaying active circuit devices. As the substrate is rotated against the polishing pad, the abrasive force grinds away the surface of the insulating layer. Additionally, chemical compounds within the slurry undergo a chemical reaction with the components of the insulating layer to enhance the rate of removal. By carefully selecting the chemical components of the slurry, the polishing process can be made more selective to one type of material than to another. For example, in the presence of potassium hydroxide, silicon dioxide is removed at a faster rate than silicon nitride. The ability to control the selectivity of a CMP process has led to increased use in the fabrication of complex integrated circuits.

A common requirement of all CMP processes is that the substrate be uniformly polished. In the case of polishing an electrical insulating layer, it is desirable to polish the layer uniformly from edge to edge on the substrate. To ensure that a planar surface is obtained, the electrically insulating layer must be uniformly removed. Uniform polishing can be difficult because several machine parameters can interact to create non-uniformity in the polishing process. For example, in the case of CMP, misalignment of the polishing wheel with respect to the polishing platen can create regions of non-uniform polishing across the diameter of the polished surface. Other machine parameters, such as non-homogeneous slurry compositions and variations in the platen pressure, can also create non-uniform polishing conditions.

The present invention relates specifically to the damascene process that is used for the formation of semiconductor surfaces. Damascene derives its name from the ancient art involving inlaying metal in ceramic or wood for decorative purposes. In Very Large-Scale Integrated circuit applications, the damascene process refers to a similar structure.

The damascene process has been demonstrated on a number of applications. The most commonly applied process is first metal or local interconnects. Some early Damascene structures have been achieved using RIE but CMP is used exclusively today. Metal interconnects using damascene of copper and of aluminum is also being explored.

Specifically, applying the CMP process to Inter Level Dielectric (ILD) and Inter Metal Dielectric (IMD) that are used for the manufacturing of semiconductor wafers, surface imperfections (micro-scratch) typically present a problem. Imperfections caused by micro-scratches in the ILD and IMD can range from 100 to 1000 EA for 200 mm. wafers, where an imperfection typically has a depth from 500 to 900 $A^0$ and a width of from 1000 to 3000 $A^0$. As part of the polishing process of the ILD and IMD, a tungsten film is deposited; the surface imperfections will be filled with tungsten during this deposition. For devices within the semiconductor wafer with a dimension of 0.35 um. or larger, an etching process is used where the tungsten that has entered the imperfections within the wafer surface can be removed. For the larger size devices within the semiconductor wafer there is therefore no negative impact on the yield of these devices. For device sizes within the semiconductor wafer of 0.25 um or less, the indicated procedure of etching the tungsten layer is no longer effective. This results in relative large imperfections within the surface of the wafer, large with respect to the size of the semiconductor devices. These imperfections will cause shorts between the metal lines within the devices while the imperfections also have a severe negative impact on device yield and device reliability.

FIG. 1 shows Prior Art removal of the Damascene residue. FIG. 1a shows the micro-scratch 40 within a substrate 14 that is filled with tungsten 45 after the deposition of a layer of tungsten 45. A typical micro-scratch is approximately 500–900 $A^0$ deep and 1000–3000 $A^0$ wide. FIG. 1b shows how the tungsten residue 45 is partially removed by CMP at the ILD and IMD but leaving a layer 50 that can readily cause electrical shorts between the metal plugs 10 adjacent to the micro-scratch 40.

U.S. Pat. No. 5,759,917 (Grover) shows a composition for on oxide CMP.

U.S. Pat. No. 5,665,202 (Subramanian) 'Multi-Step Planarization process using polishing at two different pad pressures' teaches a process for polish planarizing a fill material overlying a semiconductor substrate and includes a multi-step polishing process.

U.S. Pat. No. 5,611,941 (Booth) shows a CMP metal over oxide process.

U.S. Pat. No. 5,766,992 (Chou et al.) shows an oxide ILD planarization.

SUMMARY OF THE INVENTION

A principle objective of the present invention is to reduce the defect count for semiconductor wafer polishing using the CMP process.

Another objective of the present invention is to improve semiconductor wafer throughput during wafer polishing using the CMP process.

Another objective of the present invention is to reduce shorts between metal lines within the devices contained within the semiconductor wafer.

Another objective of the present invention is to improve reliability of the devices contained within the semiconductor wafer.

Another objective of the present invention is to reduce wafer surface irregularities (micro-scratch) within the surface of Inter Level Dielectric (ILD).

Yet another objective of the present invention is to reduce oxide film on the surface of the Inter Metal Dielectric (IMD).

Yet another objective of the present invention is to enhance the use and applicability of tungsten deposition as part of the process of semiconductor wafer CMP.

Yet another objective of the present invention is to enable reduction of semiconductor device dimensions.

Yet another objective of the present invention is to enable reduction of semiconductor device dimensions to the quarter-micro range.

Yet another objective of the present invention is to enhance the removal of tungsten damascene residue during semiconductor wafer polishing.

According to the present invention, a CMP process is provided for the reduction of tungsten damascene residue. A three step polishing procedure is followed by a two step buffing procedure. The three step polishing procedure reduces the device defect count by eliminating damascene residue from the polished surface. The two step buffing procedure reduces micro scratch within the polished surface thus improving device throughput.

BRIEF DESCRIPTION OF THE DRAWINGS

FIG. 1 shows the impact of CMP on the damascene residue.

FIG. 2 gives an overview of the Damascene process, as follows:

DETAILED DESCRIPTION OF THE PREFERRED EMBODIMENT

The processing steps of the present invention uses a three-platen polishing tool and can be broken down into distinct procedures:

1) A three step polishing sequence that uses platen one and two of the three platens. This three step polishing sequences consists of applying de-ionized (DI) water, an oxide slurry and de-ionized water polishing. Damascene residue causes metal line shorts resulting in lower device yield and impaired device reliability. The three step polishing procedure reduces the damascene residue.

2) A two step buffing procedure that uses platen one and two of the three platens. This two step buffing procedure consists of applying an oxide slurry and DI water buffing. The two buffing steps are followed by a DI water rinse. The two step buffing procedure removes approximately 1000 $A^0$ of oxide and, in so doing, reduces micro-scratch to less than 10 EA without causing new or additional micro-scratch. Conventional buffing does not remove oxide. This results in an improvement of device throughput of approximately 10%.

3) A three step polishing procedure followed by the two step buffing procedure that form the Inter Level Dielectric (ILD) polishing process and that use the third platen of the three platens. The two step buffing procedure forms the Inter Metal Dielectric (IMD) oxide Chemical Mechanical Planarization (CMP) process. A DI water rinse is added after each of these two processes.

The overall effect of the two processes, that is the three step polishing procedure followed by the two step buffing procedure, where each procedure is followed by a conventional wet CMP (WCMP), is that the Damascene residue after wet CMP is reduced from larger than 100 EA to less than 10 EA. EA indicates the particle or micro-scratch count. In addition, the yield of the devices created from the wafer being polished increases by approximately 10%. Also, the two step buffing procedure removes an oxide film of about 1000 $A^°$. Since conventional buffing procedures do not remove an oxide film, the buffing procedure of the present invention improves wafer throughput by approximately 5 to 10%.

Figure 2A:
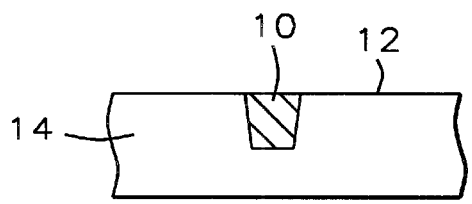
FIG. 2a shows the metal plug formed after the surface planarization.
Figure 2B:
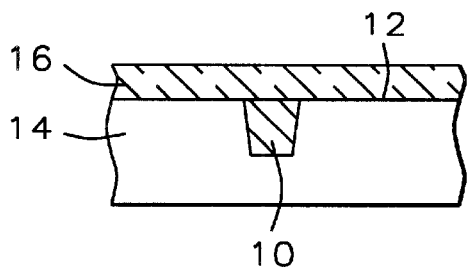
FIG. 2b shows the deposition of the Inter Level Dielectric.
Figure 2C:
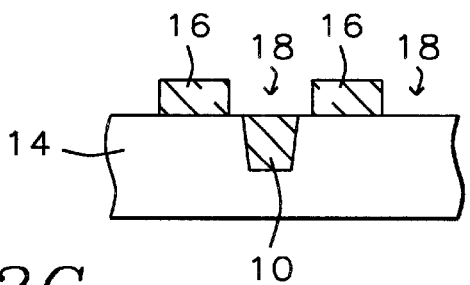
FIG. 2c shows the formation of the trenches for metal lines.
Figure 2D:
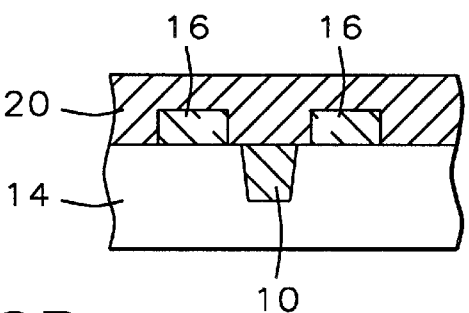
FIG. 2d shows the deposition of metal to fill the trenches.
Figure 2E:
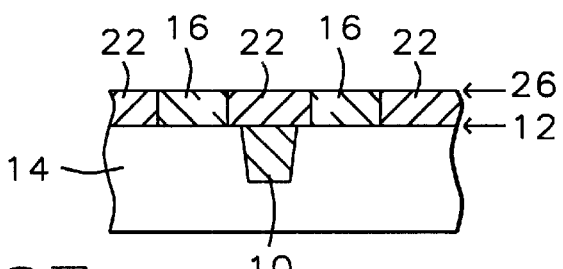
FIG. 2e shows the removal of the excess metal on the surface.

Referring now specifically to FIG. 2a, there is shown the formation of a metal via plug 10 within the semiconductor substrate 14. Any micro-scratch present on the surface 12 will fill with metal during the metal deposition. As was readily apparent from FIG. 1a, any metal damascene residue that remains on surface 12 can cause electrical shorts between adjacent via plugs 10 or between electrical lines deposited on top of surface 12. To remove the damascene residue and to reduce the scratch count on the surface 12, surface 12 is polished (a three step process, using platen 1 of the three platens within the polishing tool) and buffed (a two step process, using platen 2 of the three platens within the polishing tool) after the metal plugs 10 have been deposited. After completion of the polishing and buffing steps, a DI water rinse is further applied to the surface 12. FIG. 2b shows the deposition of the Inter Level Dielectric (ILD) 16 which can be deposited using Plasma Enhanced CVD (PECVD) techniques. Dielectric 16 can, for instance, be $SiO_2$. FIG. 2c shows the formation of the trenches 18 for the metal lines, these trenches can be formed using Reactive Ion Etching (RIE) techniques. FIG. 2d shows the deposition of metal 20 to fill the trenches 18; this process can use either the CVD or a metal flow process. The excess metal on the surface is removed using the CMP process, see FIG. 2e, and a planar structure 26 with metal inlays 22 in the dielectric 16 is achieved. The surface 26 created in this manner, the Inter Metal Dielectric, is planarized using a two step Inter Metal Dielectric (IMD) buffing process. This two step buffing process removes approximately 1000 $A^0$ oxide film thus further improving the planarity of plane 26 and, as a consequence, improve the CMP process throughput by 5–10%. Platen two of the three platens within the polishing tool is used for this buffing procedure.

As a final procedure within the ILD and IMD polishing sequence, the IMD is further polished (a three step polishing procedure) followed by (a two step) buffing procedure, both procedures using platen three of the three platen polishing tool. This final procedure removes an oxide film of about 1000 $A^°$. Since conventional buffing procedures do not remove an oxide film, the buffing procedure of the present invention improves wafer throughput by approximately 5 to 10%.

In sum:

1) plane 12, the Inter Level Dielectric plane, is (three step, using platen 1) polished, followed by (two step, using platen 2) buffing resulting in elimination of damascene residue and the reduction of the scratch count. A DI water rinse is applied after the completion of these two procedures. These procedures result in improved device yield since potential for shorts is removed.

2) plane 26, the Inter Metal Dielectric plane, is (two step, using platen 2) buffed to reduce oxide film, followed by a DI water rinse.

3) plane 26, the IMD, is polished (three steps, using platen 3) followed by buffing (two step, using platen 3), followed by DI water rinse.

Figure 3:
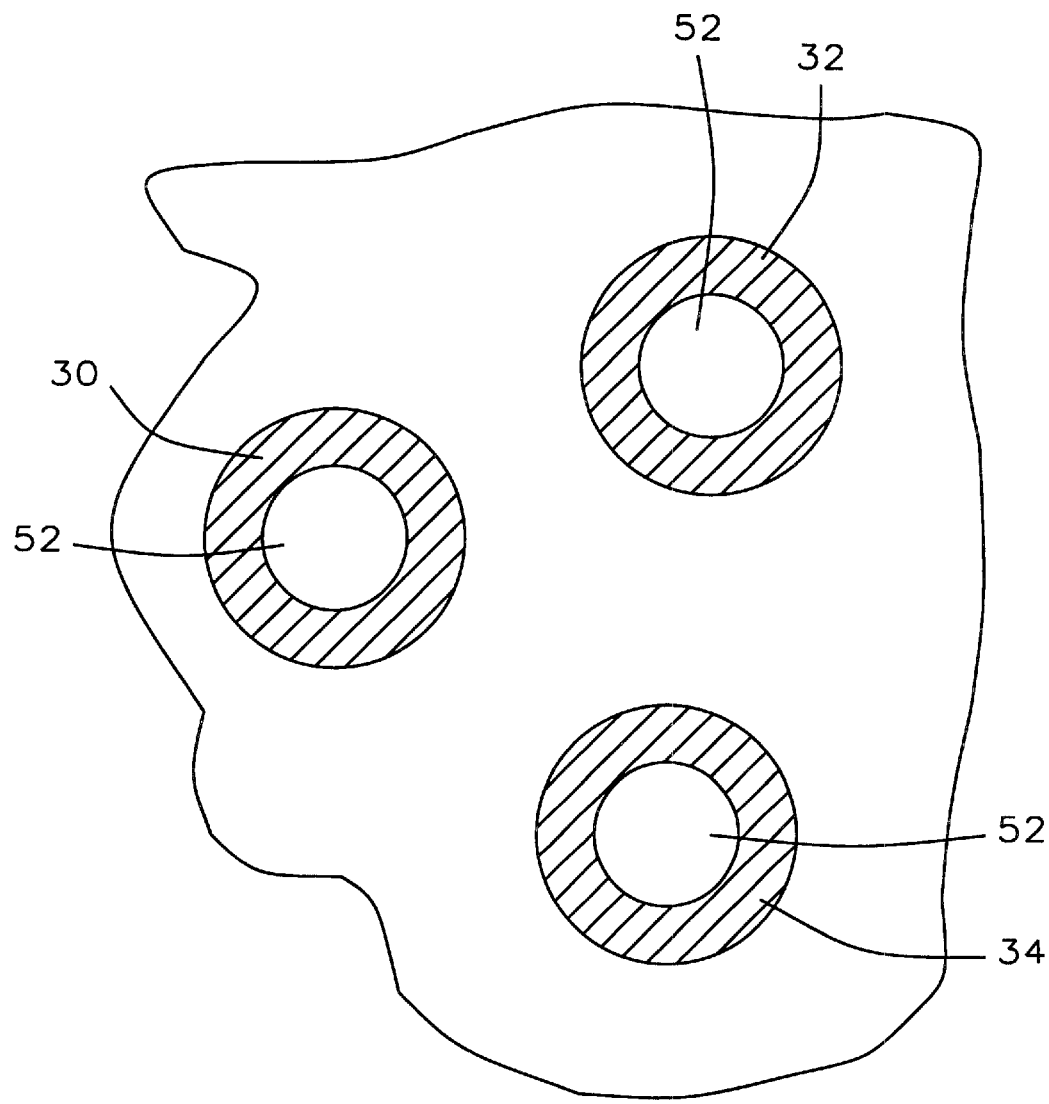
FIG. 3 shows the three polishing platforms of the wafer-polishing tool.

Referring now specifically to FIG. 3, there are shown the three polishing platforms within the wafer-polishing tool 36. Wafers 52 are shown on top of each of the three platen, that is platen 30, 32 and 34 respectively.

Platen 30 and 32, that is platen one and two of the three platen sequence of the polishing tool, use a IC 1000 hard pad for the polishing steps. Platen 30 and 32 are used for the three step polishing procedure.

Platen 34, that is the third platen within the platen sequence of the polishing tool, uses a Politex supreme pad that is characterized as consisting of a soft, compressible pad material. This pad material removes the micro-scratch formed during the three step polishing procedure.

Shown below are results that have been obtained by the processing steps as detailed within the scope of the present invention, that is the reduction in semiconductor wafer micro-scratch achieved by the addition of the buffing procedure. The layer on which these results were obtained is the Inter-metal dielectric (IMD) that has been subjected to CMP.

Column #1 shows the wafer Identification Number.

Column #2 shows the total number of imperfections measured on the IMD for that wafer (ID).

Column #3 shows the number of number of micro-scratches measured on the IMD for that wafer (ID).

The wafers with ID's 1 through 6 have been subjected to the following processing steps:

Wafer ID 1, 2, and 3: standard three step polishing procedure with DI water buffing, no (two step) buffing is applied.

Wafer 4, 5, and 6: the two step buffing procedure is added to the standard three step polishing procedure.

| Col. #1 | Col. #2 | Col. #3 |
|---------|---------|---------|
| 1 | 235 | 86 |
| 2 | 415 | 148 |
| 3 | 354 | 181 |
| 4 | 116 | 4 |
| 5 | 245 | 2 |
| 6 | 168 | 9 |

It is apparent from the above results that the improvement gained in adding the buffing steps is real and considerable both in the reduction of the number of total imperfections indicated and in the reduction of the observed micro-scratch imperfections.

Although the preferred embodiment of the present invention has been disclosed for illustrative purposes, those skilled in the art will appreciate that various modifications, additions and substitutions are possible without departing from the scope and spirit of the invention as disclosed in the accompanying claims.

What is claimed is:

1. A method of polishing and buffing the surface of a layer of Inter Level Dielectric (ILD) on the surface of a semiconductor substrate during fabricating of a semiconductor device, said polishing and buffing using pads of selected abrasive characteristics, comprising the steps of:

providing a semiconductor substrate having a surface having elevated regions and recessed regions therein having tungsten plugs grown within said layer of ILD;

providing a polishing and buffing tool, said polishing and buffing tool comprising first, second and third polishing and buffing platens whereupon pads of selected abrasive characteristics have been provided, then;

applying a three-step polishing procedure to the surface of said layer of ILD, using said first platen, said applying a three-step polishing procedure is DI water polishing followed by oxide slurry polishing followed by DI water polishing, said three-step polishing procedure removing tungsten residue from the surface of said layer of ILD, then;

applying a two-step buffing procedure to the surface of said layer of ILD, using said second polishing pad, wherein said two step buffing procedure is oxide slurry buffing followed by DI water buffing, said two-step buffing procedure removing about 1000 Angstrom of oxide from the surface of said layer of ILD, thereby reducing micro-scratch in the surface of said layer of ILD without incurring new micro-scratch; and, then applying a DI water rinse to the surface of said layer of ILD.

2. The method of claim 1 wherein said polishing pad mounted on top of the first of said three polishing platen is a hard pad thus forming the first polishing pad wherein said polishing pad mounted on top of the second of said three polishing platen is a hard pad thus forming the second polishing pad wherein said polishing pad mounted on top of the third of said three polishing platen is a soft compressible pad thus forming the third polishing pad.

3. The method of claim 1 wherein applying a rinse is applying a high-pressure DI water rinse using said second platen.

4. The method of claim 1 wherein polishing pad pressure for the retention ring of said first polishing pad is substantially within the range of 0–6.0 psi.

5. The method of claim 1 wherein rotation speed for said first polishing pad is substantially within the range of 0–15 rpm.

6. The method of claim 1 wherein acceleration for said first polishing pad is substantially within the range of 2–50 rpm.

7. The method of claim 1 wherein head sweep for said first polishing pad does not comprise sinusoidal sweep.

8. The method of claim 1 wherein a polish-I tube for said first polishing pad is vented.

9. The method of claim 1 wherein a membrane-check of said first polishing pads is a vacuum.

10. The method of claim 1 wherein delivery 1 for said polishing first pad is substantially oxide slurry delivery within the range of 150–250 SCCM.

11. The method of claim 1 wherein there is no delivery 2 for said polishing first pad wherein delivery 2 is essentially CMP DI water delivery.

12. The method of claim 1 wherein there is no high-pressure rinse for said polishing first pad.

13. The method of claim 1 wherein polishing time for said polishing first pad is substantially between 1 and 4 seconds.

14. A method of polishing and buffing the surface of a layer of Inter Metal Dielectric (IMD) on the surface of a semiconductor substrate during fabricating of a semiconductor device, said polishing and buffing using pads of selected abrasive characteristics, comprising the steps of:

providing a semiconductor substrate having elevated regions and recessed regions therein, on the surface of which said layer of Inter-metal dielectric has been formed;

providing a polishing and buffing tool, said polishing and buffing tool comprising first, second and third polishing and buffing platens whereupon pads of selected abrasive characteristics have been provided, then;

applying a two-step buffing procedure to the surface of said layer of IMD, using said second polishing platen, wherein said two step buffing procedure is oxide slurry buffing followed by DI water buffing, said two-step buffing procedure removing about 1000 Angstrom of oxide from the surface of said layer of IMD, thereby reducing micro-scratch in the surface of said layer of IMD without incurring new micro-scratch, then;

applying a three-step polishing procedure to the surface of said layer of IMD, using said third polishing platen, wherein said three step polishing procedure is DI water polishing followed by oxide slurry polishing followed by DI water polishing, said three-step polishing procedure removing tungsten residue from the surface of said layer of IMD; and, then applying rinse to the surface of said layer of IMD.

15. The method of claim 14 wherein the first and second of said polishing pads are hard pads thus forming the first and second polishing pads respectively while the third of said polishing pads is a soft pad consisting of compressible material thus forming the third polishing pad.

16. The method of claim 14 wherein said applying rinse is applying DI water rinse.

17. A method of polishing the Inter Level Dielectric within a semiconductor substrate during fabricating of a semiconductor device comprising the steps of:

provding an Inter Level Dielectric surface within a semiconductor having elevated regions and recessed regions;

providing a polishing and buffing tool, said polishing and buffing tool comprising multiple polishing and buffing platens whereupon pads of selected abrasive characteristics have been provided, then;

applying a multi-step polishing procedure to said Inter Level Dielectric surface, said multi-step polishing procedure removing tungsten residue from the surface of said layer of ILD, then;

applying a multi-step buffing procedure to said Inter Level Dielectric surface, said multi-step buffing procedure removing a measurable amount of oxide from the surface of said layer of ILD, thereby reducing micro-scratch in the surface of said layer of ILD by a measurable amount without incurring new micro-scratch; and, then applying a rinse to said Inter Level Dielectric surface.

18. The method of claim 17 wherein said polishing tool is a polishing apparatus consisting of three polishing platen wherein a polishing pad is mounted on the top surface of each of said platen wherein said polishing applies the third of said three polishing platens wherein said third polishing pad mounted on the top surface of said third polishing platen is a soft compressible pad thus forming the third polishing pad.

19. The method of claim 17 wherein said polishing procedure is a three step procedure.

20. The method of claim 19 wherein said three step procedure is DI water polishing using said third polishing pad followed by oxide slurry polishing using said third polishing pad followed by DI water polishing using said third polishing pad.

21. The method of claim 17 wherein said buffing procedure is a two step procedure.

22. The method of claim 17 wherein said two step buffing procedure is oxide slurry buffing using said third polishing pad followed by DI water buffing using said third polishing pad.

23. The method of claim 17 wherein applying a rinse is applying a high pressure rinse using said third platen.

24. A method of polishing and buffing the surface of a layer of Inter Level Dielectric (ILD) on the surface of a semiconductor substrate during fabricating of a semiconductor device, said polishing and buffing using pads of selected abrasive characteristics, comprising the steps of:

providing a semiconductor substrate having a surface having elevated regions and recessed regions therein having tungsten plugs grown within said layer of ILD;

providing a polishing and buffing tool, said polishing and buffing tool comprising a first , a second and a third polishing and buffing platens whereupon pads of selected abrasive characteristics have been provided, then;

applying a three step polishing procedure to said surface of said layer of ILD using said first polishing platen, said three step procedure is DI water polishing followed by oxide slurry polishing followed by DI water polishing, said three-step polishing procedure removing tungsten residue from the surface of said layer of ILD, then;

applying a two step buffing procedure to said surface of said layer of ILD using said second polishing platen, said two step buffing procedure is oxide slurry buffing followed by DI water buffing, said two-step buffing procedure removing about 1000 Angstrom of oxide from the surface of said layer of ILD, thereby reducing micro-scratch in the surface of said layer of ILD without incurring new micro-scratch; and, then applying a DI water rinse to said surface of said layer of ILD.

25. The method of claim 24 wherein said polishing pad mounted on top of the first of said three polishing platens is a hard pad thus forming the first polishing pad wherein said polishing pad mounted on top of the second of said three polishing platens is a hard pad thus forming the second polishing pad wherein said polishing pad mounted on top of the third of said three polishing platens is a soft compressible pad thus forming the third polishing pad.

26. A method of polishing and buffing the surface,of a layer of Inter Metal Dielectric (IMD) on the surface of a semiconductor substrate during fabricating of a semiconductor device, said polishing and buffing using pads of selected abrasive characteristics, comprising the steps of:

providing a semiconductor substrate having elevated regions and recessed regions therein, on the surface of which said layer of Inter-metal Dielectric has been formed;

providing a polishing and buffing tool, said polishing and buffing tool comprising a first, a second and a third polishing and buffing platens whereupon a first, a second and a third polishing and buffing pad have been provided, the first and second of said polishing pads are hard pads while the third of said polishing pads is a soft pad consisting of compressible material, then;

applying a two step buffing procedure to the surface of said layer of IMD, using said third polishing pad, said two step buffing procedure is oxide slurry buffing followed by DI water buffing, said two-step buffing procedure removing a about 1000 Angstrom of oxide from the surface of said layer of IMD, thereby reducing micro-scratch in the surface of said layer of ILD without incurring new micro-scratch, then;

applying a three step polishing procedure to the surface of said layer of IMD using said third polishing pad, said three step procedure is DI water polishing followed by oxide slurry polishing followed by DI water polishing, said three-step polishing procedure removing tungsten residue from the surface of said layer of IMD; and, then applying a DI water rinse to the surface of said layer of IMD.

* * * * *